(12) United States Patent
Regelskis et al.

(10) Patent No.: US 10,038,297 B2
(45) Date of Patent: Jul. 31, 2018

(54) METHOD AND GENERATOR FOR GENERATING ULTRA-SHORT LIGHT PULSES

(71) Applicant: Valstybinis Moksliniu Tyrimu Institutas Fiziniu Ir Technologijos Mokslu Centras, Vilnius (LT)

(72) Inventors: Kestutis Regelskis, Vilnius (LT); Gediminas Raciukaitis, Vilnius (LT)

(73) Assignee: Valstybinis Moksliniu Tyrimu Institutas Fiziniu Ir Technologijos Mokslu Centras, Vilnius (LT)

( * ) Notice: Subject to any disclaimer, the term of this patent is extended or adjusted under 35 U.S.C. 154(b) by 0 days.

(21) Appl. No.: 15/329,459

(22) PCT Filed: Jul. 21, 2015

(86) PCT No.: PCT/EP2015/066645
§ 371 (c)(1),
(2) Date: Jan. 26, 2017

(87) PCT Pub. No.: WO2016/020188
PCT Pub. Date: Feb. 11, 2016

(65) Prior Publication Data
US 2017/0207597 A1     Jul. 20, 2017

(30) Foreign Application Priority Data
Aug. 6, 2014 (LT) ..................... 2014 505

(51) Int. Cl.
*H01S 3/117* (2006.01)
*H01S 3/30* (2006.01)
(Continued)

(52) U.S. Cl.
CPC ...... *H01S 3/06791* (2013.01); *H01S 3/06754* (2013.01); *H01S 3/08027* (2013.01);
(Continued)

(58) Field of Classification Search
CPC ............... H01S 3/06791; H01S 5/5018; H01S 3/08027; H01S 3/06754; H01S 3/106; H01S 3/1112
See application file for complete search history.

(56) References Cited

U.S. PATENT DOCUMENTS

2006/0187537 A1\* 8/2006 Huber .................... H01S 3/106
359/337.22
2012/0275474 A1   11/2012 Aguergaray et al.

FOREIGN PATENT DOCUMENTS

EP        1720223 A1   11/2006

OTHER PUBLICATIONS

Fermann et al. "Generation of 10 nJ picosecond pulses from a modelocked fibre laser", Electronics Letters, IEEE Stevenage, GB, vol. 31, No. 3, pp. 194-195; Feb. 1995.
(Continued)

*Primary Examiner* — Yuanda Zhang
(74) *Attorney, Agent, or Firm* — Brown & Michaels, PC

(57) ABSTRACT

This invention relates to the field of laser technology and more particularly to the ultra-short pulse generation methods and generators. One round trip of the ultra-short light pulse formation inside a generator optical loop comprises these steps: amplification of the light pulse, spectral broadening of the amplified light pulse due to the optical Kerr effect inside the optically transparent medium, selection of the predeterminated spectral components of the spectrally broadened light pulses by using the first spectrally-sensitive optical element, then again follows amplification of the selected light pulses, spectral broadening of the amplified light pulse due to the optical Kerr effect inside the optically transparent medium and selection of the predeterminated spectral components of the spectrally broadened light pulses by using the second spectrally-sensitive optical element, where spectral components of the light pulses selected using the first
(Continued)

spectrally-sensitive optical element are different than the spectral components of the light pulses selected using the second spectrally-sensitive optical element.

11 Claims, 2 Drawing Sheets

(51) Int. Cl.
*H01S 3/067* (2006.01)
*H01S 3/106* (2006.01)
*H01S 3/11* (2006.01)
*H01S 3/08* (2006.01)
*H01S 5/50* (2006.01)

(52) U.S. Cl.
CPC ............ *H01S 3/106* (2013.01); *H01S 3/1112* (2013.01); *H01S 5/5018* (2013.01)

(56) References Cited

OTHER PUBLICATIONS

International Preliminary Report on Patentability for PCT/EP2015/066645 dated Jul. 15, 2016.
International Search Report for PCT/EP2015/066645 dated Nov. 26, 2015.

* cited by examiner

METHOD AND GENERATOR FOR GENERATING ULTRA-SHORT LIGHT PULSES

TECHNICAL FIELD TO WHICH INVENTION RELATES

The proposed invention relates to the field of laser technology, particularly to a method and generator of ultra-short light pulse generation due to the spectral broadening of amplified light pulses caused by the optical Kerr effect in an optically transparent material and the double spectral separation of the light pulses at different parts of the pulse generator.

INDICATION OF THE BACKGROUND

There are known the ultra-short pulse generation method and device, which operation are based on the longitudinal laser mode-locking, where the mode-locking is achieved by using a saturable absorber, which is made from the tapered segment of an optical fiber, around which a mixture of relevant polymer and carbon nanotubes is wrapped. Light, propagating through the tapered segment of the optical fiber, penetrates outside and interacts with the carbon nanotubes. Saturable absorption and mode-locking are possible due to the unique characteristics of carbon nanotubes. Known method and device are described in the United States patent application US2011/0280263A1, 2011.

The disadvantage of this method and device is that the saturable absorbers based on the carbon nanotubes and polymer mixture, similarly to the saturable semiconductor absorbers (SESAM), tend to degrade. A lifetime of the oscillator is strongly limited due to this adverse feature. In addition, using this method, sometimes is not possible to achieve mode-locking due to the improper spectral, temporal and energetic characteristic of the carbon nanotubes.

There are known the ultra-short pulse generation method and device, which operation are based on the longitudinal laser mode-locking, where the mode locking is achieved by the nonlinear polarization rotation effect due to the optical Kerr effect inside an optical fiber, where pulse formation inside the resonator with a normal dispersion is achieved by spectral filtering of the spectrally broadened pulse caused by self-phase modulation due to the optical Kerr effect inside the optically transparent material. Strongly chirped picosecond pulses are created inside the resonator of the oscillator because of spectral filtering, and laser pulses can be compressed up to femtosecond durations at the output of the oscillator. The known method and device are described in the United States patent application US2010220751A1, 2010.

The disadvantage of this known method and device is that it is very unstable to any external disturbances, sensitive to the ambient temperature fluctuations and is suitable for use only under laboratory conditions. Even in this way, the parameters of the generated pulses are often unpredictable because the mode locking is achieved using non-polarization maintaining optical fibers.

Technical Problem to be Solved

The aim of this invention is to increase the output power stability of the generated ultra-short light pulses, reliability and simplicity of optical scheme, its resistance to external environmental disturbances, resistance to aging degradation, and reduce the cost.

DISCLOSURE OF INVENTION

In order to solve above problem according proposed method for generating ultra-short light pulses, wherein one round trip of the ultra-short light pulse formation inside a generator optical loop, where pulse propagates in the closed trajectory, comprises the steps of: amplification of the light pulse; spectral broadening of the amplified light pulse due to the optical Kerr effect in an optically transparent material; selecting of spectral components of the spectrally broadened light pulses, using a first spectrally-sensitive optical element, wherein double spectral selection of broadened light pulses of different wavelength is performed. The first spectrally-sensitive optical element selects light pulses of the predetermined wavelengths, while light pulses of the other wavelengths are directed away from the generator optical loop; the selected light pulses of the predetermined wavelengths using the first spectrally-sensitive optical element can be amplified again and further are spectrally broadened for the second time due to the optical Kerr effect in other optically transparent material or in the above-mentioned optically transparent material; the spectrally broadened light pulses for the second time are separated into spectral components using a second spectrally-sensitive optical element by selecting light pulses of predetermined wavelengths, while the light pulses of the other wavelengths are directed away from the generator optical loop, wherein predetermined wavelengths of the light pulses selected using the first spectrally-sensitive optical element are different than the wavelengths of the light pulses selected using the second spectrally-sensitive optical element, wherein said cycle of the operation sequence is repeated by propagating the light pulses in the generator optical loop and formation of the ultra-short light pulses takes place.

The closed trajectory in which the light pulses propagate may be circular trajectory and forms ring-type optical loop of the ultra-short light pulses generator.

The closed trajectory in which the light pulses propagate may be a linear one where the light pulses propagate forth and back in the same overlapping trajectory, and it forms a linear-type optical loop of the ultra-short light pulses generator.

According to another embodiment of the present invention an ultra-short light pulse generator is proposed, which comprises an optical loop in which are arranged: at least one light pulse amplifier; at least one optically transparent material, where optical Kerr effect manifests; a spectrally-sensitive optical element; means for extracting the light pulses away from the optical loop and means designed to input a seed pulse into the optical loop, wherein two spectrally-sensitive optical elements are provided which are designed to select light pulses of predetermined wavelengths, where predetermined wavelengths selected by using the first spectrally-sensitive optical element are different than the predetermined wavelengths selected by using the second spectrally-sensitive optical element, wherein the optically transparent material, where optical Kerr effect manifests and the optical amplifier, are placed in the optical loop of the ultra short light pulse generator between the spectrally-sensitive optical elements, wherein the first and second spectrally-sensitive optical elements are chosen in such a way, that their spectra of the selection do not overlap until spectrum of the light pulses is broadened in at least one of above-mentioned optically transparent materials or their spectra of selection overlap until losses of the formed laser resonator in the optical loop due to the spectra overlap are higher than its amplification, the means for extracting the light pulses away from the generator optical loop are designed to extract light pulses of the other wavelengths, than predetermined wavelengths selected by spectrally-sensitive optical elements.

The optical loop of the generator may be of a ring-type, where in the ring-type optical loop are placed: at least one amplifier, two said optically transparent materials, where the optical Kerr effect manifests, alternately one after another with the corresponding spectrally-sensitive optical elements The optical loop of the generator may be of a linear-type, where in the linear-type optical loop are placed two spectrally-sensitive optical elements between which are placed: least one above-mentioned optically transparent material, where the optical Kerr effect manifests and at least one amplifier, wherein end reflectors of the linear-type optical loop are provided, which reflect the selected wavelengths of the light pulses back to optical loop of the pulse generator.

The means designed to input the seed pulse comprises at least one input branch of the pulse generator, which may be optically connected to a pulsed light source, preferably to a pulsed laser source.

The means for extracting the light pulses away from the generator comprises light pulse output branches of the pulse generator wherein at least one said output branch may be optically connected with at least one said seed pulse input branch of the generator via an optical means, wherein said optical means can be the Q-switch or optical switch of the laser.

The spectrally-sensitive optical elements are said amplifier and the spectrum-selection filtering function of the light pulses are performed by the wavelength-dependent gain band of the amplifier.

The light pulses are amplified and spectrally broadened due to the optical Kerr effect within the same optically transparent-gain material, for instance, gain fiber or laser gain medium.

There is provided an external amplifier, preferably fiber amplifier, which is optically connected to any of the generator output branches.

The ultra-short light pulse generator is of all-in-fiber design, namely, entirely built from optical fibers and fiber components. The whole ultra-short light pulse generator is built from the fiber elements, namely optical fibers and fiber components.

Advantages of the Invention

This method allows generating the light pulses with the energy of several nanojoules (nJ) and about 1 ps duration. In most cases, depending on design features of the pulse generator, the generated light pulses are linearly chirped, so, the pulses can be compressed down to femtosecond durations using an external pulse compressor. The pulse generator can be built using optics fibers, which can be the polarization-maintaining or not maintaining fibers, as well as the pulse generator is extremely stable and resistant to the temperature fluctuations, it is stable and reliable because there are no degrading elements such as saturable semiconductor absorber (e.g. SESAM). It is possible a very wide practical choice of the generated light pulse parameters (pulse duration, energy, repetition rate, temporal characteristics, spectral characteristics, etc.) depending on the design features (length of the passive and active optical fibers, fiber core diameter, spectral characteristics of the spectrally selective optical elements, characteristics and gain of the amplifiers). The pulse generation is possible independently of the total scheme dispersion of the pulse generator, the total dispersion of the pulse generator scheme can be equal to zero, normal or anomaly. Only the temporal and spectral characteristics of the pulses depend on the scheme dispersion of the pulse generator.

The spectral broadening of light pulses can be realized using any non-linear effects related to the optical Kerr effect, i.e., self-phase modulation, cross-phase modulation, four wave mixing. In general, the pulse spectral broadening can be realized in any optically transparent material (glass, optical fiber, liquid, photonic crystal, gas and etc.), in which the optical Kerr effect is manifesting (cubic non-linearity is not zero, i.e. $\chi^{(3)} \neq 0$. The light pulses can be amplified using any amplifiers: laser (quantum) amplifiers, optical parametric amplifiers (operating on three-wave or four-wave non-linear interaction principle), Raman amplifiers, Brillouin amplifiers, semiconductor optical amplifiers, fiber amplifiers. The spectral selection of the light pulses can be performed using dielectric filters (band-pass, short-pass, long-pass, multi-pass and etc.), Bragg mirrors, fiber Bragg gratings, diffraction gratings, Lyot filters, acousto-optical tunable filters, Fabry-Perot interferometers or any other optical elements that are characterized by the wavelength sensitivity.

The ultra-short light pulse generator can start operation by injecting a seed pulse through the seed input branch or by connecting the generator seed input branch with the generator output branch for a short time. In this way, the generator optical loop is spectrally opened for a short time period (the time period of said connecting is, approximately equal or shorter than time period) within the light pulse travels around the generator optical loop), and, thus, it forms a laser resonator in which the seed pulse occurs from a spontaneous noise. The seed input and output branches of the generator can be optically connected by using the well-known pulsed lasers Q-switches, high-speed optical switches, both active and passive (acousto-optical modulator, Pockels cell, electro-optical modulator, mechanical switch, rotating prism or mirror, piezoelectric switch, saturable semiconductor absorber, SESAM and etc.). Also, the ultra-short pulse generator can be started by overlapping spectral characteristics of the spectrally-selective optical elements for a short time period and, thereby, forming a laser resonator in which the seed pulse occurs from a spontaneous noise. The seed pulse parameters should match only approximately with the generator output pulse parameters (duration, energy, spectrum width, spectral phase, temporal shape and so on) and can be different in several orders. After entering of a seed pulse in the generator optical loop, the generator pulses are formed after several roundtrips with the relevant characteristics, and at the output branch of the generator, the ultra-short light pulses with stable characteristics (energy, temporal, spectral) are generated. Not only one circulating pulse but also a certain number of pulses can be excited and generated inside the pulse generator optical loop. The ring circuit configuration of the pulse generator allows generation of contra-propagating pulses. The pulse generator is resistant to the Fresnel reflection and Fabry-Perot etalons that occur in the generator optical loop, and, for this reason, the generator optical loop can consist of different kind of optical fibers. Inside the optical loop, a hollow core photonic crystal fibers (PCF) can be spliced without fear of the Fresnel reflections that potentially may disturb the generator running. The pulse generator can be made of all-in-fiber design by splicing fibers with each other and with other fiber components (fiber hubs, WDM, fiber Bragg gratings, fiber polarizer, fiber mirrors, fiber pigtailed pump diodes). The generator can be made from the polarization-maintaining and non-maintaining optical fibers, single-mode and large-mode-area fibers. The generated pulses can be compressed down to the spectrum-limited pulse duration (femtoseconds) at the generator output by connecting the appropriate length of a hollow-core PCF fiber with the anomalous group velocity dispersion to the output branches of the generator (e.g. HC-1060 fiber, NKT Photonics).

The terminology used:

Spectrally-selective optical element SSOE (wavelength-sensitive optical element): dielectric filter, interference filter, dichroic mirror, fiber Bragg grating, volume Brag grating, diffraction grating, prism, Lyot filter, acousto-optical tunable filter, Fabry-Perot interferometer, amplifier with the corresponding gain band and other means with spectral selectivity.

Amplifier: laser (quantum) amplifier, optical parametric amplifier (operating on three waves or four waves non-linear interaction principle), Raman amplifier, Brillouin amplifier, semiconductor optical amplifier, optical fiber amplifier and other mean for optical amplification.

Optically transparent material which is characterized by the optical Kerr effect: optical fiber, photonic crystal fiber, photonic crystal, glass, liquid, optical gain fiber or any other optically transparent material with third-order (cubic) optical nonlinearity $\chi^{(3)} \neq 0$.

Q-switch or optical switch: acousto-optical modulator, Pockels cell, an electro-optical modulator, a mechanical switch, rotating prism or mirror, piezoelectric switch, SESAM, saturable semiconductor absorber and, etc.

Optical means: amplifier, the optically transparent material characterized by an optical Kerr effect (with the cubic optical nonlinearity $\chi^{(3)} \neq 0$ and spectrally selective optical element.

The pulse generator optical loop: a closed trajectory in which the light pulses are propagating and where optical means of the pulse generator are placed. By analogy with the laser resonator, the pulse generator optical loop can be of circular configuration when the light pulses are propagating circularly in one direction, or the pulse generator optical loop can be linear, when a pulse travels forth and back in the same closed overlapping trajectory.

Light pulses propagating through the optically transparent material are spectrally broadened due to the optical Kerr effect. The spectrally-broadened pulses enter the first spectrally-selective optical element (SSOE I), which selects certain wavelengths of the light pulses and directs them to the amplifier. The others wavelengths are directed to the first output branch. The light pulses, spectrally separated by SSOE I, are amplified in the second amplifier (but not necessarily), and again are spectrally broadened due to the optical Kerr effect in the optically transparent material. Spectrally broadened light pulses enter the second spectrally-selective element (SSOE II), which selects certain wavelengths of the light pulses, but not the same wavelengths, which are selected by SSOE I, and directs them to the first amplifier. Others wavelengths SSOE II are directed to the second output branch. The light pulses spectrally selected by SSOEII are again amplified by the first amplifier and are spectrally broadened due to the optical Kerr effect in the optically transparent material. This process of the light pulse amplification, the light pulse spectral broadening due to the optical Kerr effect and spectra-separation are continuously repeated, and ultra-short light pulses are generated. The first and second spectrally-selective optical elements can be of any spectral characteristics, however SSOE I and SSOE II together do not select the same wavelengths, consequently the spectra of the light pulses that are returned to the generator optical loop are separated, and the generator optical loop is spectrally closed for the full round-trip of the light pulses. Because the optical loop of the generator is spectrally closed, consequently, any longitudinal laser mode cannot be exited, and, for this reason, the proposed pulse generation method is not related to the conventional mode-locking.

The length of the pulse generator optical loop—this is the total propagation path of the light pulse through the optical loop of the generator until the light pulse returns to the previous position and propagates in the same direction. The optical loop of the pulse generator can be of the ring configuration, where pulses travel in one direction around the optical loop, or the optical loop of the pulse generator can by of the linear configuration, where the pulse travels forward and backward in the same overlapping trajectory.

DETAILED DESCRIPTION OF EMBODIMENTS OF THE INVENTION

The proposed ultra-short light pulse generation method, wherein one round trip of the ultra-short light pulse formation inside a generator optical loop, where pulse propagates in the closed trajectory, comprises the following steps: light pulses amplification, spectral broadening of the amplified light pulses due to the optical Kerr effect in an optically transparent material, selection of spectral components of the spectrally broadened light pulses with the first spectrally-selective optical element (SSOE I), which separates the light pulses of a predetermined wavelength, while other wavelengths are directed away from the generator optical loop, amplification of the spectrally-separated light pulses with SSOE I (if necessary), spectral broadening of the amplified light pulses due to the optical Kerr effect in an optically transparent material, spectral separation of the spectrally broadened light pulses with the second spectrally-selective optical element (SSOE II), which selects the light pulses of a predetermined wavelengths, which is different than the wavelengths separated by SSOE I, while other wavelengths are delivered to the second output branch. The light pulses spectrally separated with SSOE II are returned to their original position, and then a sequence of operations is repeated cyclically.

Figure 1:
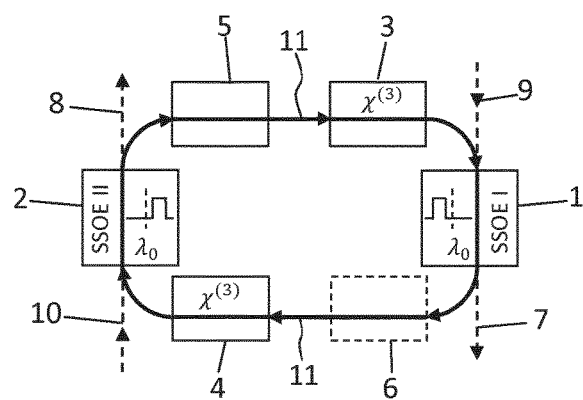
FIG. 1.—Optical loop of the proposed generator in which all optical means are set out one after the other in a circle and they form a ring-type optical loop of the ultra-short light pulse generator.

The proposed ultra-short light pulse generator, where the light pulses are spectrally broadened due to the optical Kerr effect in the optically transparent materials (3, 4) shown in FIG. 1. All optical means (5, 3, 1, 6, 4, 2) are placed consistently in a circle and the path of light pulse propagation trajectory forms a ring-type optical loop 11. The light pulses amplified by the amplifier 5 are spectrally broadened in the optically transparent material 3, the spectrally broadened light pulses propagate through SSOE I 1, which selects the light pulses of a certain wavelength, light pulses of other wavelengths are directed to the first output branch 7. The spectrally-separated light pulses transmitted through SSOE I 1 are directed to the amplifier 6. The light pulses amplified by the amplifier 6 (but not necessarily) again are spectrally broadened in the optically transparent material 4 and enter SSOE II 2, which selects—the light pulses of certain wavelengths, while light pulses of other wavelengths are directed to the second output branch 8. SSOE I 1 and SSOE II 2 do not select (transmit) the light pulses with the same wavelength. The spectrally-separated light pulses passed through SSOE II 2 are directed to the amplifier 5. After that, the sequence of operations is repeated cyclically again. The ultra-short light pulse generator is started by injecting a seed pulse through any of the seed input branches (9, 10), or optically connecting the first output branch 7 with the first seed input branch 9 or the second output branch 8 to the second seed input branch 10 for a short time. In addition, the ultra-short light pulse generator can be started by temporal overlapping of the spectral characteristics of SSOE I 1 and SSOE II 2. Consequently, the optical loop 11 of the pulse generator is spectrally opened, and the laser resonator is formed and a seed pulse occurs from the spontaneous noise. Furthermore, the amplifier 6 is not required, if the peak power of the spectrally-selected light pulse by SSOE I 1 is sufficient to broaden the spectrum in the optically transparent material 4.

FIG. 1. Ultra-short pulse generating apparatus with the ring-type circuit. 1—the first spectrally-selective optical element; 2—the second spectrally-selective optical element; 3, 4—optically transparent materials, where, due to the optical Kerr effect (self-phase modulation or cross-phase modulation or four-wave mixing) the spectrum of the light pulses is broadened; 5, 6—amplifiers, where the light pulses are amplified; 7, 8—the first and second output branches of the ultra-short light pulse generator; 9, 10—the first and second seed input branches; 11—the ultra-short light pulse generator of the ring-type scheme.

Figure 2:
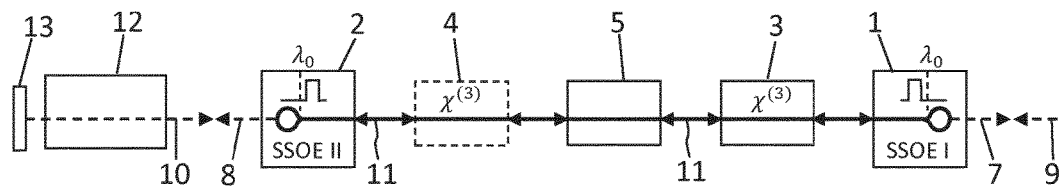
FIG. 2.—Optical scheme of the proposed device in which all optical means are set out one after the other, the light pulses propagate forth and back in the same overlapping closed trajectory and the means form a linear optical loop of the ultra-short light pulse generator. In addition, the scheme shows the Q-switch for excitation of the ultra-short light pulse generator.

FIG. 2 Shows another ultra-short light pulses generating apparatus with the linear-type optical loop (11), where all optical means (2, 4, 5, 3, 1) are placed sequentially and the light pulse propagation path forward and backward overlap and comprise a linear-type optical loop 11 in which the light pulses are spectrally broadened due to the optical Kerr effect in the optically transparent materials 3, 4. The light pulses amplified by the amplifier 5 are spectrally broadened in the optically transparent material 3, than the spectrally-broadened light pulses enter SSOE I 1 which separates and returns only certain wavelengths of the light pulses, the other wavelengths are delivered to the first output branch 7. The light pulses spectrally separated by SSOE I 1 and returned back re-enter the optically transparent material 3. During propagation of the pulses through the optically transparent material 3 in the backward direction, the pulse spectrum may be slightly broadened, as a peak power of the spectrally-separated and returned pulses can be insufficient. After that, the light pulses re-enter the amplifier 5, the light pulses amplified by amplifier 5 are spectrally broadened the other optically transparent material 4 and enter SSOE II 2, which separates-returns only certain wavelengths of light pulses while the rest of wavelength arrives at the second output branch 8. Together SSOE I 1 and SSOE II 2 do not separate and return the light pulses of the same wavelength to the generator loop 11. The light pulses, spectrally separated by SSOE II 2 and returned back, re-enter the optically transparent material 4, during propagation of the light pulses through the optically transparent material 4 in backward direction, the pulse spectrum may be slightly broadened, as the peak power of the spectrally-separated and returned pulses can be insufficient. After that, the pulses again re-enter the amplifier 5, and the sequence of operations is repeated cyclically. The ultra-short pulse generator is started by injecting a seed pulse through any of the seed input branch (9, 10), or the output branch 8 is shortly connecting with the seed input branch 10. The Q-switch 12 is opened for a short time, and with the mirror 13 connecting the output branch 8 with the seed input branch 10, a laser resonator is formed in which the seed pulse develops from a spontaneous noise. In a similar way, the first seed input branch 9 with the first generator output branch 7 can be connected. Alternatively, the ultra-short light pulse generator can be started by overlapping the spectral characteristics of SSOE I 1 and SSOE II 2 for the short time, wherefore the linear optical loop 11 of the pulse generator is spectrally opened, the laser resonator is formed, and a seed pulse develops from spontaneous noise. In addition, the optically transparent material 4 is not necessary since the light pulses returning from SSOE 1 are sufficiently intense to achieve adequate spectral broadening in the optically transparent material 3.

FIG. 2. Ultra-short pulses generator of the linear-type scheme with the Q-switch 12 for the seed pulse developing. 1 the first spectrally-selective optical element; 2 the second spectrally-selective optical element; 3, 4 optically transparent materials, in which due to the optical Kerr effect (self-phase modulation or cross-phase modulation or four-wave mixing) spectrum of the light pulses is broadened; 5 amplifier, where the light pulses are amplified; 7, 8 first and second output branches of the light pulse generator; 9, 10 first and second seed input branches; 11 linear-type circuit of the light pulse generator; 12 Q-switch (modulator); 13 mirror.

Figure 3:
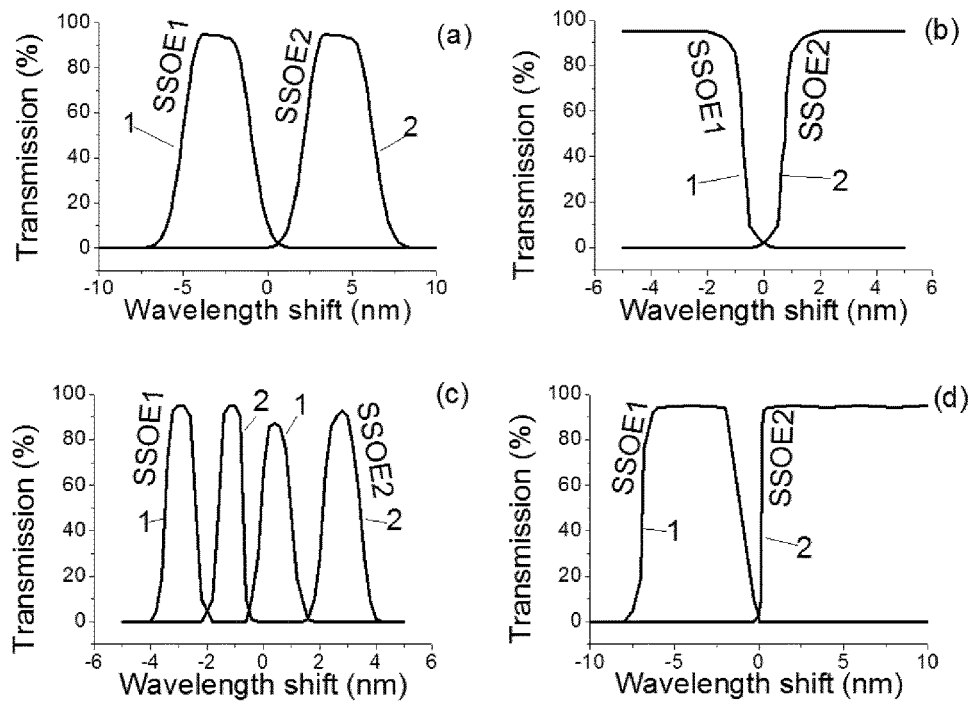
FIG. 3.—Examples of the transmittance characteristics depending on the wavelength of the first and second spectrally-selective optical elements, in this particular case the spectral filters.

FIG. 3. Illustrates examples of transmission characteristics depending on the wavelength of the first 1 and second 2 spectrally-selective optical elements (1, 2), in this case, of the filters. FIG. 3a illustrates spectral characteristics of the band-pass filters, transmission bands of the first and second filters (1, 2) are separated. Transmission bands of the spectral filters (1, 2) can slightly overlap until losses of the formed laser resonator are higher than its amplification, and a lasing does not start. FIG. 3b illustrates characteristics of the edge filters. The first filter 1 passes only short wavelengths, and the second filter 2 passes only long wavelengths. FIG. 3c shows characteristics of the multiband filters. Bands of the first and second filters (1, 2) do not overlap or overlap but the lasing does not start. In FIG. 3c it is shown when the first filter 1 is a band-pass one and the second filter 2 is an edge-cut one, which transmits only the long wavelengths.

In all examples, the spectral transmission functions of the first 1 and second 2 filters do not overlap or overlap until losses of the formed laser cavity is higher than the amplification and free-running generation does not start.

FIG. 3. Examples of the transmission characteristics depending on the wavelength of the first 1 and second 2 spectrally-selective optical elements, in this case, of the filters: a first filter 1 and second filter 2 are band-pass filters; b edge filters, the first filter 1 is a short-pass filter, the second filter 2 is a long-pass filter; c multiband filters, bands of the first and second filter (1 and 2) do not overlap or overlap until the free-running generation starts when laser resonator is formed, that is to say, losses of the formed laser resonator are higher than its amplification.

Figure 4:
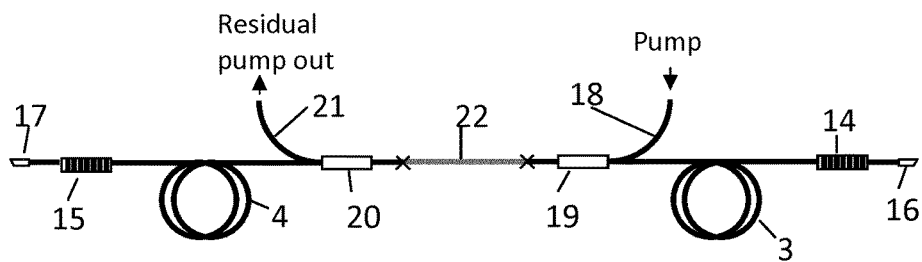
FIG. 4.—Shows the scheme of the proposed generator, which consists entirely of fibers and fiber components, and the scheme configuration of the fiber generator is linear.

FIG. 4 shows another, all-in-fiber, the ultra-short light pulse generating apparatus with the linear-type optical loop. The whole ultra-short light pulse generating apparatus is built from optical fibers and fiber components, which are spliced to each other. In this particular case, the spectrally-selective optical elements (1, 2) are fiber Bragg gratings (14, 15), the light pulses are amplified in the gain fiber 22, which can be doped with Yb ions, the light pulses are spectrally broadened in the optical fiber 3, 4. The light pulses amplified in the gain fiber 22 propagate through the signal-pump combiner 19 and are spectrally broadened in the optical fiber 3, the spectrally-broadened pulses enter the first fiber Bragg grating 14, a certain part of the light pulse spectrum is reflected from the fiber Bragg grating 14 and returns back, the transmitted part of the pulse spectrum enters the first output/seed input branch with the connector 16 and comes out. The returning spectrally-separated light pulses travel again through the optical fiber 3, pass through the signal-pump fiber combiner 19 and enter the gain fiber 22. The amplified light pulses pass through the signal-pump fiber combiner 20 and are spectrally broadened in the optical fiber 4, the spectrally broadened pulses enter the second fiber Bragg grating 15, a certain part of the light pulse spectrum is reflected by the fiber Bragg grating and returns back, the transmitted part of the pulse spectrum enters the second output/seed input branch with the connector 17 and comes out. The light pulses reflected from the fiber Bragg grating 15 and returning back, propagate again through the optical fiber (4), pass through the signal-pump fiber combiner 20 and enter the gain fiber 22. The following sequence of operations is repeated cyclically again and again. Reflection spectra of the first and second fiber Bragg gratings 14 and 15 do not overlap or overlap until losses of the formed laser resonator are higher than its amplification. The ultra short light pulse generator is started by injecting a seed pulse through any of the seed input/output branches with a connector (16, 17) or shortly reflecting the radiation generated by the generator back to any output branch with a connector (16, 17), thereby creating a laser resonator, which develops a seed pulse from the spontaneous noise. A pump radiation is entered into the gain fiber 22 through the pump radiation input branch 18 of the signal-pump fiber combiner 19. The pump radiation unabsorbed by fiber 22 is carried out through the pump radiation output branch 21 of the pump-signal fiber combiner 20.

FIG. 4. All-in-fiber ultra-short light pulse generator, the spectrally broadened light pulses are filtered by the fiber Bragg grating (14, 15). 3, 4—passive optical fibers, where pulses are spectrally broadened due to the optical Kerr effect; 16, 17—the ultra-short light pulses output and seed input branches with the connectors; 19, 20—pump and signal combiners (WDM); 18—pump input branch; 21—output branch of the unabsorbed pump radiation; 22—gain fiber.

The ultra-short light pulse generator may have more than two spectrally-selective optical elements intended to separate the components of the light pulses of the predetermined wavelengths, while the light pulses of the other wavelengths are carried from the generator through the output branches. In this generator, between the spectrally-selective optical elements, there are placed the optically transparent materials, which are characterized by the optical Kerr effect, creating the scheme of the generator, where there is placed at least one optical amplifier, where each of the said spectrally-selective optical elements separates spectrally the light pulses of different wavelengths, for which spectra can overlap when propagating between the adjacent spectrally-selective optical elements, however, after light pulses pass all the above mentioned spectrally-selective optical elements in a closed trajectory within the generator optical loop, their spectra do not overlap until spectra of the light pulses are spectrally broadened due to the optical Kerr effect in the above-mentioned optically transparent materials, or their spectra overlap until due to the overlapping of the spectra, the losses of the formed laser resonators are higher than its amplification.

The invention claimed is:

1. Method for generating ultra-short light pulses, wherein one round trip of the ultra-short light pulse formation inside a generator optical loop, where light pulse propagates in a closed trajectory, comprising the steps of:
   a) amplification of the light pulse in an amplifier;
   b) spectral broadening of the amplified light pulse due to an optical Kerr effect in a first optically transparent material;
   c) selecting spectral components of the spectrally broadened light pulses, using a first spectrally-sensitive optical element;
   d) the first spectrally-sensitive optical element selecting spectral components of the light pulses in a first range of predetermined wavelengths, while other spectral components of the light pulses are directed away from the generator optical loop;
   e) the light pulses of the first predetermined range of wavelengths being selected using the first spectrally-sensitive optical element are amplified again and are further spectrally broadened for a second time due to the optical Kerr effect in a second optically transparent material or in the first optically transparent material;
   f) spectrally broadened light pulses for the second time are spectrally separated using a second spectrally-sensitive optical element by selecting the spectral components of the light pulses corresponding to a second predetermined range of wavelengths, while spectral components of the light pulses of the other wavelengths are directed away from the generator optical loop;
   g) the first predetermined range of wavelengths of the light pulses selected using the first spectrally-sensitive optical element do not spectrally overlap with the second predetermined range of wavelengths of the light pulses selected using the second spectrally-sensitive optical element, and the selected spectral components of the light pulses of the first predetermined range of wavelengths using the first spectrally-sensitive optical element do not spectrally overlap with the selected spectral components of the light pulses of the second predetermined wavelengths range using the second spectrally-sensitive optical element.

2. The method of claim 1, in which the closed trajectory in which the light pulses propagate is a circular trajectory forming a ring-type optical loop of the ultra-short light pulse generator.

3. The method of claim 1, in which the closed trajectory in which the light pulses propagate is linear, such that the light pulses propagate back and forth in the same overlapping trajectory and the closed trajectory forms a linear-type optical loop of the ultra-short light pulse generator.

4. Ultra-short light pulse generator for generating light pulses, comprising an optical loop in which are arranged:
   a) at least one light pulse amplifier;

b) at least one optically transparent material, where an optical Kerr effect manifests and spectral broadening of the light pulse appears;

c) a first spectrally-sensitive optical element designed to select spectral components of the light pulses in a first range of predetermined wavelengths;

d) means for extracting the light pulses away from the optical loop;

e) means designed to input a seed pulse into the optical loop;

f) a second spectrally-sensitive optical element designed to select spectral components of the light pulses in a second range of predetermined wavelengths;

g) the optically transparent material, where the optical Kerr effect manifests and the at least one optical amplifier, are placed in the optical loop of the ultra short light pulse generator between the first spectrally-sensitive optical element and the second spectrally-sensitive optical element;

h) the first spectrally-sensitive optical element and the second spectrally-sensitive optical element are chosen such that the first range of predetermined wavelengths and the second range of predetermined wavelengths are different and do not overlap or overlaps until continuous wave generation starts; and i) the means for extracting the light pulses away from the optical loop of the generator are designed to extract light pulses of other wavelengths than the first range of predetermined wavelengths and the second range of predetermined wavelengths selected by the first spectrally-sensitive optical element and the second spectrally-sensitive optical element.

5. The ultra-short light pulse generator of claim 4, in which the optical loop of the generator is of ring-type, comprising:

a) the at least one amplifier; and b) at least two optically transparent materials, where the optical Kerr effect manifests, alternately one after another with the corresponding first spectrally-sensitive optical element and the second spectrally-sensitive optical element.

6. The ultra-short light pulse generator of claim 4, in which the optical loop of the generator is of linear-type, comprising a first spectrally-sensitive optical element and a second spectrally-sensitive optical element, between which are placed:

a) at least one of the optically transparent material, where the optical Kerr effect manifests; and b) the at least one amplifier, wherein end reflectors of the linear-type optical loop are provided which reflect the selected wavelengths of the light pulses back to the optical loop of the pulse generator.

7. The ultra-short light pulse generator of claim 4 in which the means designed to input the seed pulse comprises at least one input branch of the pulse generator, which is optically connected to a pulsed light source, preferably to a pulsed laser source.

8. The ultra-short light pulse generator of claim 4 in which the means for extracting the light pulses away from the generator comprises light pulse output branches of the pulse generator wherein at least one said output branch is optically connected with at least one said seed pulse input branch of the generator via an optical means, wherein said optical means can be a Q-switch or optical switch of a laser.

9. The ultra-short light pulse generator of claim 8 further comprising an external amplifier, which is optically connected to a generator output branch.

10. The ultra-short light pulse generator of claim 8 in which the ultra-short light pulse generator is entirely built from optical fibers and fiber components.

11. The ultra-short light pulse generator of claim 4 in which the optical loop of the generator is linear, such that the light pulses propagate back and forth in a same overlapping trajectory and a closed trajectory forms a linear-type optical loop of the ultra-short light pulse generator.

* * * * *